(12) United States Patent
Nakamura

(10) Patent No.: US 8,816,983 B2
(45) Date of Patent: Aug. 26, 2014

(54) ELECTRONIC DEVICE

(75) Inventor: Toshikatsu Nakamura, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 13/477,331

(22) Filed: May 22, 2012

(65) Prior Publication Data

US 2013/0162551 A1 Jun. 27, 2013

(30) Foreign Application Priority Data

Dec. 26, 2011 (JP) .................................. 2011-284350

(51) Int. Cl.
*G06F 3/041* (2006.01)

(52) U.S. Cl.
USPC .......................... 345/173; 178/18.01; 200/511

(58) Field of Classification Search
USPC .................... 345/173–179; 178/18.01–18.09; 200/511, 600
See application file for complete search history.

(56) References Cited

U.S. PATENT DOCUMENTS

| | | | | |
|---|---|---|---|---|
| 5,917,165 | A | * | 6/1999 | Platt et al. ...................... 200/600 |
| 2008/0302649 | A1 | | 12/2008 | Yamauchi et al. |
| 2009/0290358 | A1 | | 11/2009 | Nakamura |
| 2009/0322709 | A1 | | 12/2009 | Lee et al. |
| 2011/0122082 | A1 | * | 5/2011 | Orellana ...................... 345/173 |
| 2013/0162551 | A1 | | 6/2013 | Nakamura |

FOREIGN PATENT DOCUMENTS

| | | |
|---|---|---|
| JP | 62-180923 | 8/1987 |
| JP | 11-202806 | 7/1999 |
| JP | 2001-60068 | 3/2001 |
| JP | 2008-046252 | 10/2005 |
| JP | 2006-59565 | 3/2006 |
| JP | 2006-126735 | 5/2006 |
| JP | 2008-305766 | 12/2008 |
| JP | 2009-111996 | 5/2009 |
| JP | 2009-238518 | 10/2009 |
| JP | 2009-283422 | 12/2009 |
| JP | 2010-001557 | 1/2010 |
| JP | 2010-15557 | 1/2010 |
| JP | 2010-123379 | 6/2010 |
| JP | 2011-060170 | 3/2011 |
| JP | 2011-113893 | 6/2011 |
| JP | 2011-96369 | 12/2011 |
| JP | 5127980 | 1/2013 |

OTHER PUBLICATIONS

Japanese Patent Application No. 2012-235907, First Office Action, mailed Nov. 19, 2013, (with English Translation).
Japanese Patent Application No. 2011-284350, First Office Action, mailed Jul. 10, 2012, (with English Translation).

* cited by examiner

*Primary Examiner* — Premal Patel
(74) *Attorney, Agent, or Firm* — Blakely, Sokoloff, Taylor & Zafman LLP

(57) ABSTRACT

According to one embodiment, the electronic device of this embodiment includes a housing, a first substrate provided in the housing and including a sensor region configured to sense a touch of a hand and a translucent portion provided on an inner side of the sensor region, a second substrate separated from the first substrate and includes a light source configured to emit light towards the translucent portion and an elastic member intermediated between the first and the second substrate and including a through hole portion inside of which the light source and the translucent portion are provided, in which an edge portion which defines a circumference of the through hole portion is situated on an outer side to the translucent portion and on an inner side to the sensor region.

8 Claims, 6 Drawing Sheets

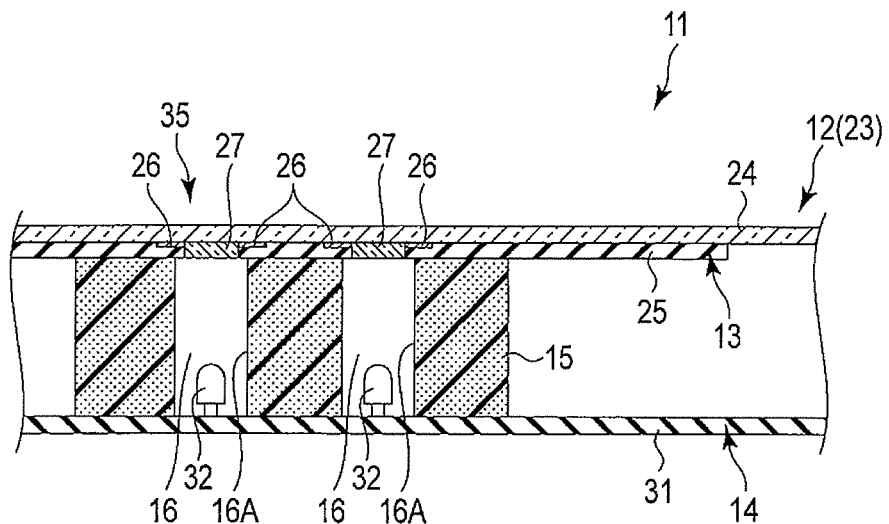
F I G. 3
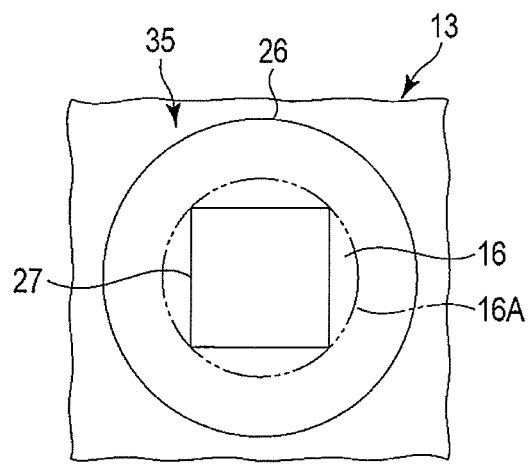
F I G. 4

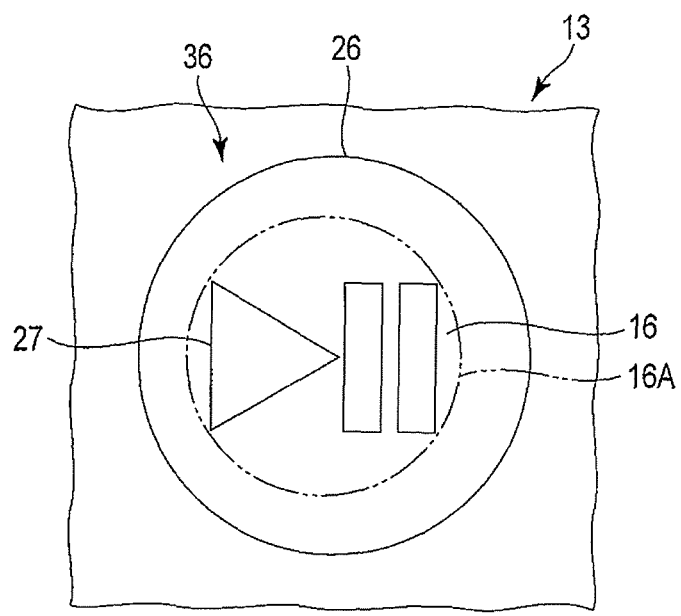
F I G. 7
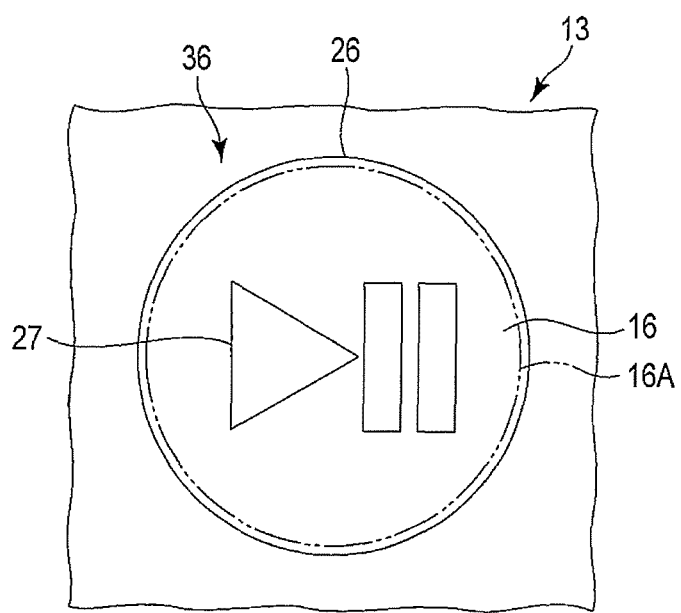
F I G. 8

US 8,816,983 B2

ELECTRONIC DEVICE

CROSS-REFERENCE TO RELATED APPLICATIONS

This application is based upon and claims the benefit of priority from prior Japanese Patent Application No. 2011-284350, filed Dec. 26, 2011, the entire contents of which are incorporated herein by reference.

FIELD

Embodiments described herein relate generally to an electronic device comprising, for example, a touch sensor.

BACKGROUND

It is general that a touch sensor is provided for an electronic device, and in many cases, the touch sensor section is illuminated with a light source such as an LED. Therefore, the touch sensor section is relatively conspicuous to the user. Thus, in many cases, the quality appearance of a whole device depends greatly on the structure of the touch sensor section. Accordingly, there have been technical needs for the improvement of this section.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is an exemplary cross sectional view showing the part of the housing, the first substrate, the second substrate and the elastic member along a horizontal direction;

FIG. 4 is an exemplary front view showing a sensor region and a light transmitting portion, a through hole portion of the elastic member and an edge portion, which correspond to a stop button of the first substrate shown in FIG. 2;

FIG. 7 is an exemplary front view showing a sensor region and a light transmitting portion, a through hole portion and an edge portion of the elastic member, which correspond to a playback/pause button of the first substrate shown in FIG. 2;

FIG. 8 is an exemplary front view showing a sensor region and a light transmitting portion of a first substrate, a through hole portion and an edge portion of an elastic member of a third modified version of the optical disk player of the first embodiment;

DETAILED DESCRIPTION

Various embodiments will be described hereinafter with reference to the accompanying drawings.

In general, according to one embodiment, the electronic device of this embodiment includes a housing, a first substrate provided in the housing and including a sensor region configured to sense a touch of a hand of a user and a translucent portion provided on an inner side of the sensor region, a second substrate separated from the first substrate and includes a light source configured to emit light towards the translucent portion and an elastic member intermediated between the first substrate and the second substrate and including a through hole portion inside of which the light source and the translucent portion are provided, in which an edge portion which defines a circumference of the through hole portion is situated on an outer side to the translucent portion and on an inner side to the sensor region.

The first embodiment of an optical disk player (optical display reproduction device), which is an example of the electronic device, will now be described with reference to FIGS. 1 to 8. An optical display player is configured to be connected to a display a display device such as a television and output images, music, etc. to the display device based on data stored on an optical disk (storage media such as CD, DVD and Blue-ray Disk).

Figure 1:
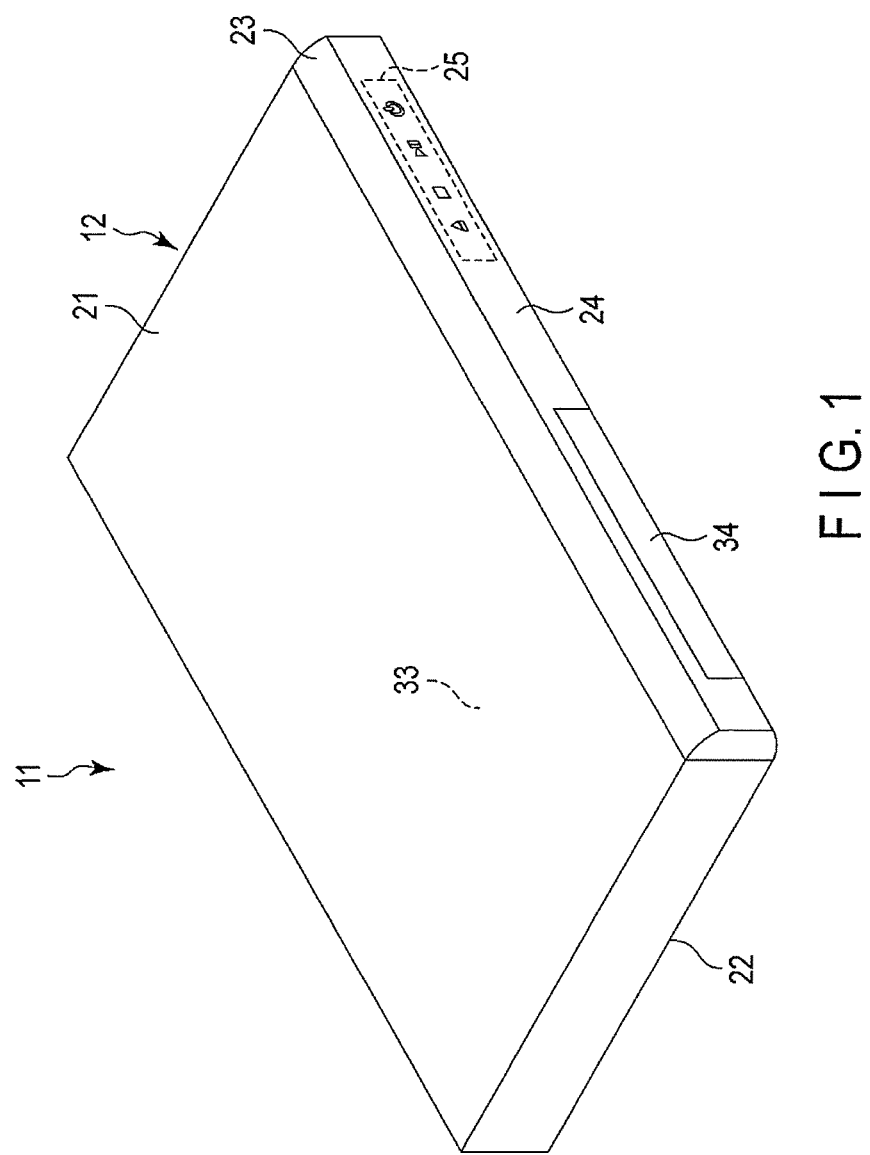
FIG. 1 is an exemplary perspective view of an optical disk player, which is an example of the electronic device of the first embodiment.
Figure 2:
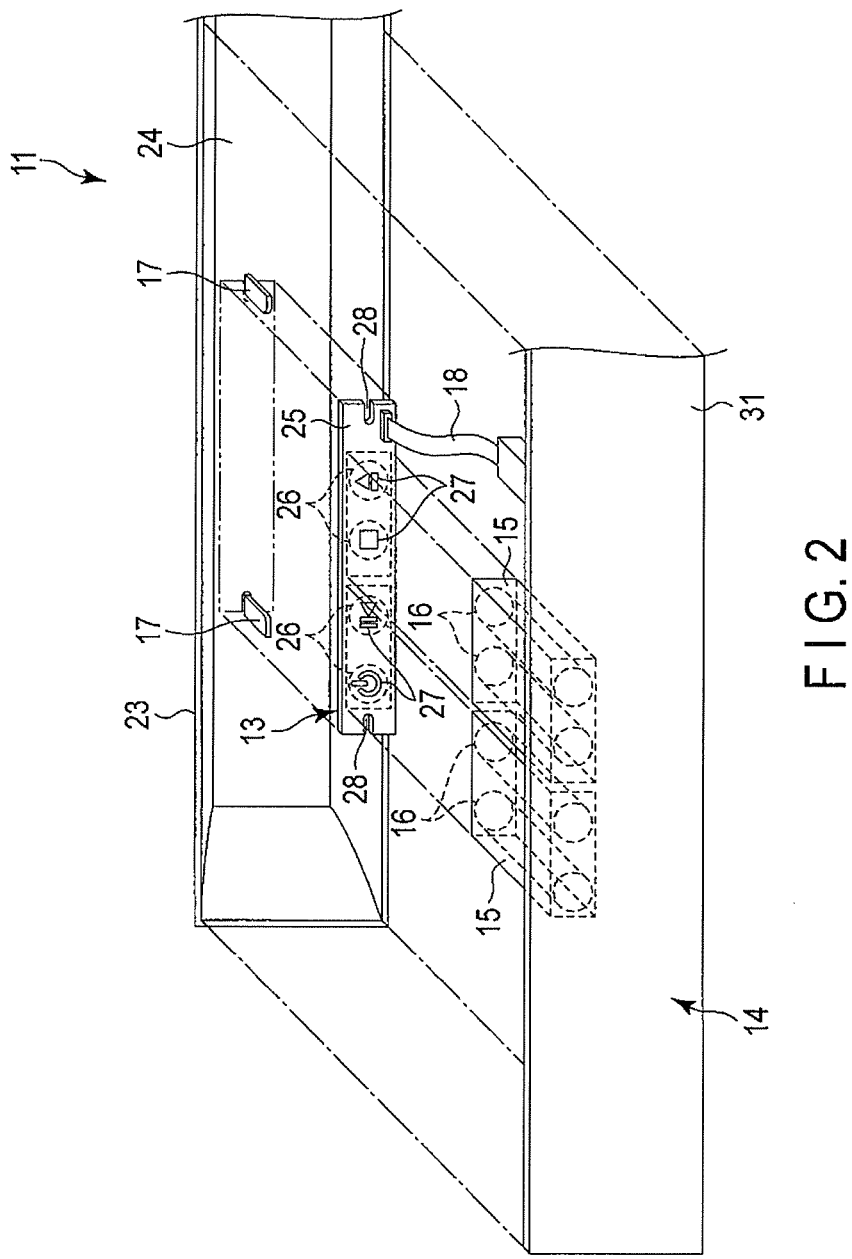
FIG. 2 is an exemplary exploded perspective view of the optical disk player shown in FIG. 1, shown from an inner side with a part of the housing, a first substrate, a second substrate and an elastic member being exploded.
Figure 5:
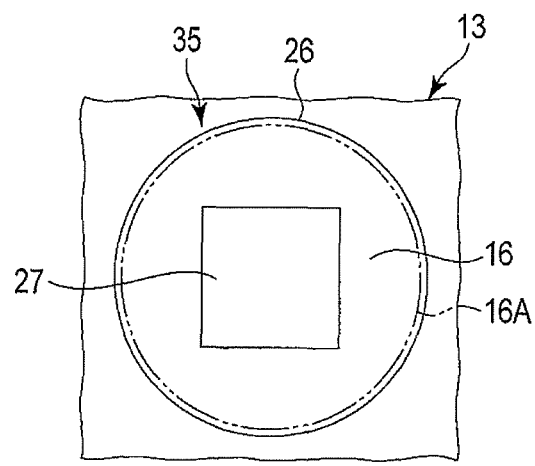
FIG. 5 is an exemplary front view showing a sensor region and a light transmitting portion of a first substrate, a through hole portion and an edge portion of an elastic member of a first modified version of the optical disk player of the first embodiment.

As shown in FIGS. 1 and 2, an optical player 11 comprises a housing 12 made of, for example, a synthetic resin material, into a box shape, a first substrate 13 serving as a touch sensor and housed inside the housing 12, a second substrate 14 housed inside the housing 12 and containing a light source therein, an elastic member 15 interposed between the first substrate 13 and the second substrate 14, a plurality of through hole portions 16 made through the elastic member 15, a positioning section 17 configured to position the first substrate 13 and provided in the housing 12, and a cable 18 (flexible cable) configured to connect the first substrate 13 and the second substrate 14 to each other. The housing 12 is formed into a box shape as assembling a plurality of parts, for example, a first case 21 (upper case) serving as a top board, second case 22 (bottom case) constituting a bottom wall and side walls, a third case 23 (front case) constituting a front wall, etc. The third case 23 of the housing 12 comprises a transparent window section 24 (transparent panel) at a position corresponding to the first substrate 13. The light emitting state of the first substrate 13 can be confirmed from outside through the window section 24.

As shown in FIGS. 2 and 3, the first substrate 13 is provided to be in tight contact with the window section 24 of the third case 23 of the housing 12. The first substrate 13 is a capacitance sensor substrate, which can sense, for example, a touch of a hand (palm, finger, etc.) of a user to the housing 12 located close to the first substrate 13, or a location of a hand (palm, finger, etc.) of a user close to the first substrate 13. The first substrate 13 comprises an opaque first substrate main body 25 having a rectangular plate shape, a plurality of opaque sensor regions 26 (capacitance switches) each formed into, for example, a circular shape in the first substrate main body 25, and a plurality of translucent portions 27 each provided within each respective sensor region 26 and formed into a predetermined shape. In the substrate main body 25, for example, a pair of notches 28 are made, into which the positioning sections 17 are put. With this structure, the substrate main body 25 is positioned with respect to the housing 12 (the third case 23) by the positioning sections 17. The translucent portions 27 are difference from each other in size. (See FIGS. 2, 4 and 7.) Accordingly, the through hole portions 16 are different in size from each other.

The second substrate 14 is fixed to the third case 23 with fixing means such as a screw as it fits to the inner side of the third case 23. The second substrate 14 comprises a second substrate main body 31 and a plurality of LEDs 32 mounted on the second substrate main body 31 and serving as light sources. Each of the LEDs 32 is constituted by the so-called top view type (lamp type) which can emit light in a direction crossing (normal to) a plane made by the second substrate 14 and is configured to emit light towards the respective translucent section 27.

As shown in FIG. 2, the positioning sections 17 each have a rib shape projecting towards the inside of the housing 12, and make, for example, a pair to correspond to the notches 28. As shown in FIG. 1, the optical disk player 11 further comprises, for example, an optical disk reading section 33, a tray 34 on which optical disks are loaded, a control circuit board on which circuit parts including CPU are mounted.

As shown in FIG. 2, this embodiment comprises two of the elastic members 15. The elastic members 15 are each made of a rubber or a synthetic resin material into a sponge form. In this embodiment, the elastic members 15 are adhered to the second substrate 14. The embodiment is not limited to this structure, but the elastic members 15 may be adhered to the first substrate 13. As shown in FIG. 3, each of the elastic members 15 comprises two through hole portions 16, and two edge portions 16A which define the circumferences of the through hole portions 16, respectively. Inside each of the through hole portions 16, an LED 32 which serves as a light source and a translucent portion 27 are disposed. The two through hole portions 16 of each of the elastic members 15 are punched through with, for example, a punch having a predetermined shape. It should be noted here that each elastic member 15 may be formed to have one rectangular block shape in which four of the through hole portions 16 are made side by side.

Next, with reference to FIGS. 3 and 4, the positions of the translucent portion 27 and the sensor region 26 of the first substrate 13, and the edge portion 16A of each through hole portion 16 of each elastic member 15 with relative to each other will now be described by taking as an example the stop button 35 configured to stop playback. In the case of the stop button 35, the translucent portion 27 has a rectangle shape. The sensor region 26 has a circular shape. In this embodiment, the edge portion 16A of each through hole portion 16 has a circular shape, whose circumference passes at corner positions of the rectangle of the translucent portion 27. Thus, the edge portion 16A (the section of the edge portion 16A which is brought into contact with the first substrate 13) is located on an outer side to the translucent portion 27 but on an inner side to the sensor region 26 in a plane parallel to the first substrate 13. With this structure, the light emitted from the LED 32 is concentrated onto the translucent portion 27.

The shape of the edge portion 16A of each through hole portion 16 is not limited that shown in FIG. 4. For example, as in the first modified version shown in FIG. 5, the edge portion 16A may be disposed to be along the sensor region 26 at a closest position to the edge within the sensor region 26, that is, to have a circular shape having a diameter slightly smaller than that of the circular shape of the sensor region 26. With this structure as well, the light emitted from the LED 32 is concentrated onto the translucent portion 27.

Figure 6:
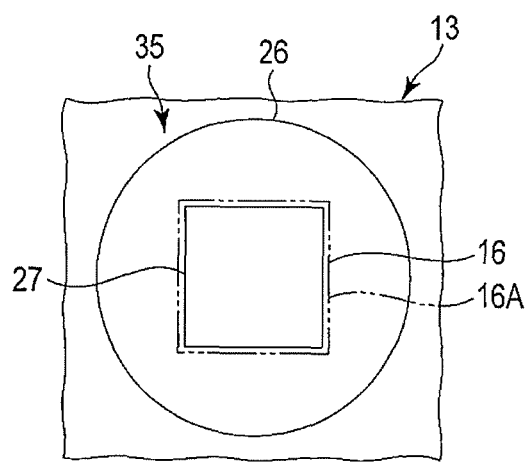
FIG. 6 is an exemplary front view showing a sensor region and a light transmitting portion of a first substrate, a through hole portion of an elastic member and an edge portion of a second modified version of the optical disk player of the first embodiment.

Further, as in the second modified version shown in FIG. 6, the shape there of the edge portion 16A may be disposed such that is along the translucent portion 27 at a closest position to the outer side of the translucent portion 27, that is, to have a rectangular shape having a side slightly longer than that of the rectangular shape of the translucent portion 27. With this structure, the light emitted from the LED 32 is concentrated onto the translucent portion 27. As is clear from FIGS. 4 to 6 explained so far, as long as the edge portion 16A is located on an outer side to the translucent portion 27 and on an inner side to the sensor region 26, the translucent portion 27 can be brightly illuminated regardless of whatever shape the edge portion 16 may be formed into.

Further, with reference to FIG. 7, the positions of the translucent portion 27 and the sensor region 26 of the first substrate 13, and the edge portion 16A of each through hole portion 16 of each elastic member 15 with relative to each other will now be described by taking as an example the playback/pause button 36 configured to playback and pause. In the case of the playback/pause button 36, the translucent portion 27 has a shape of a combination of a triangle and two rectangles (geometrical shape), and it is larger in size than the translucent portion 27 of the stop button 35. The sensor region 26 has a circular shape. Further, in this embodiment, the edge portion 16A of each through hole portion 16 has a circular shape, whose circumference passes at corner positions of the geometrical shape of the translucent portion 27. It should be noted here that the circular shape of the edge portion 16A which corresponds to the playback/pause button 36 is located to be displaced with respect to the center of the sensor region 26 (translucent 27) (de-centered), for example, and is formed larger than the edge portion 16A of each through hole portion 16 corresponding to the stop button 35. The edge portion 16A (the section of the edge portion 16A which is brought into contact with the first substrate 13) is located on an outer side to the translucent portion 27 and on an inner side to the sensor region 26 in a plane parallel to the first substrate 13. With this structure, the light emitted from the LED 32 is concentrated onto the translucent portion 27.

The shape of the edge portion 16A of each through hole portion 16 is not limited that shown in FIG. 7. For example, as in the third modified version shown in FIG. 8, the edge portion 16A may be disposed to be along the sensor region 26 at a closest position to the edge within the sensor region 26, that is, to have a circular shape having a diameter slightly smaller than that of the circular shape of the sensor region 26. With this structure as well, the light emitted from the LED 32 is concentrated onto the translucent portion 27.

As is clear from FIGS. 7 and 8, as long as the edge portion 16A is located on an outer side to the translucent portion 27 and on an inner side to the sensor region 26, the translucent portion 27 can be brightly illuminated regardless of whatever shape the edge portion 16 may be formed into (that is, circular, rectangular or a shape along the geometric shape of the translucent portion).

According to the first embodiment, the optical disk player 11 comprises the housing 12, the first substrate 13 provided inside the housing 12 and comprising the sensor region configured to sense a touch of a hand of the user and the translucent portion 27 provided on an inner side of the sensor region 26, the second substrate 14 separated from the first substrate 13 and comprising the light source which emits light towards the translucent portion 27, the elastic member 15 intermediated between the first substrate 13 and the second substrate 14 and comprising the through hole portions 16 inside of each of which the light source and the translucent portion 27 are provided, wherein the edge portion 16A which defines the circumference of each of the through hole portions 16 is situated on an outer side to the respective translucent portion 27 and on an inner side to the sensor region 26.

With this structure, the light source and the translucent portion 27 are situated inside the respective through hole portion 16, and therefore the translucent portion 27 can be illuminated brightly with the light of the light source. In this manner, the appearance of the electronic device can be improved and an upscale image can be given to the electronic device. Further, with this structure, the light from the light source can be concentrated onto the translucent portion 27 without diffusing the light unnecessarily to such a wide range. In particular, the embodiment takes such a structure that the light is emitted to the translucent portion 27. Therefore, with this structure, it is possible to prevent the decrease in the brightness of the sensor region 26 as a whole, which may occur when the light were set to illuminate the entire sensor region 26. Further, it should be noted here that the user is supposed to usually touch the vicinity of the translucent portion 27, and therefore such an defect that the desired function is not operated if the button is touched can be avoided even with such a structure is taken that the entire sensor region 26 is not illuminated.

The housing 12 comprises the positioning sections 17 configured to position the first substrate 13. With this structure, the first substrate 13 can be positioned by the positioning sections 17. Further, the first substrate 13 can be located away from the second substrate 14 by a certain distance by the resilient force of the elastic members 15. Thus, fixing means such as a screw, which fixes the first substrate 13 or adhesion means such as a double-sided tape can be omitted. In this manner, the operability in the assembly can be improved, and further the first substrate 13 can be easily removed in the case of maintenance work including repairing.

The elastic members are formed into sponge shapes. With this structure, the elastic members can be made light in weight and accordingly the entire electronic device can be made light in weight. Further, a reflection plate and the like can be omitted, thereby making it possible to reduce the production cost.

The translucent portions 27 have sizes different from each other, and the through hole portions 16 are different from each other in size. With this structure, light can be emitted appropriately towards the translucent portions 27 in accordance with the size of each respective transparent portion 27. Thus, it is possible to prevent the light from unnecessarily diffusing to the surroundings, and therefore the light can be concentrated onto each respective translucent portion 27.

Next, with reference to FIGS. 9 and 10, the second and third embodiments of the electronic device will now be described. An optical disk player 11, which is an example of the electronic device of each of the second and third embodiments is different from that of the first embodiment in the shapes of through hole portions 16 of elastic members 15 and edge portions 16A, but the other members are the same as those of the first embodiment. Therefore, in the following descriptions, the different portions will be mainly explained, and the common members will not be explained or illustrated.

Figure 9:
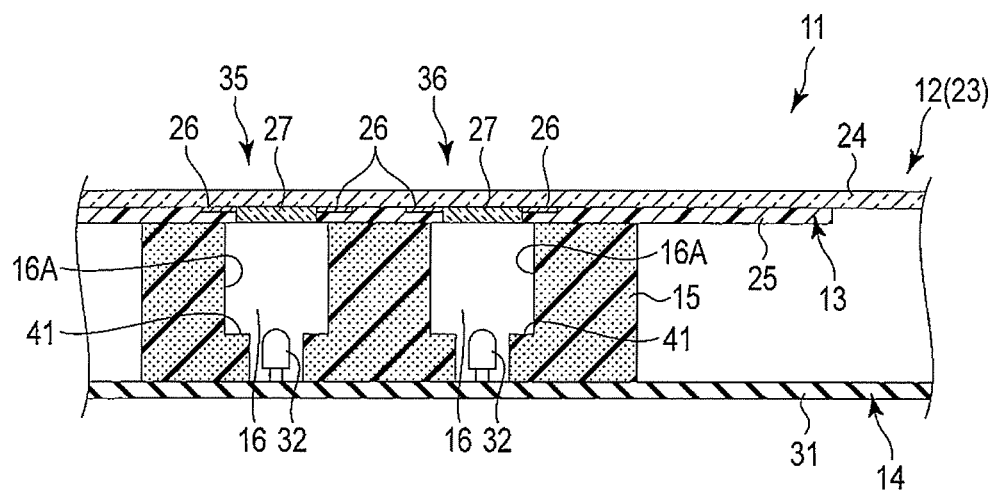
FIG. 9 is an exemplary cross sectional view showing along a horizontal direction, a part of a housing, a first substrate, a second substrate and an elastic member of an optical disk player, which is an example of the electronic device of the second embodiment.

The optical disk player 11 of the second embodiment shown in FIG. 9 comprises two elastic members 15. (Note that FIG. 9 shows only one elastic member.) The elastic members 15 are each made of a rubber or a synthetic resin material into a sponge form. In this embodiment, the elastic members 15 are adhered to the second substrate 14. The embodiment is not limited to this structure, but the elastic members 15 may be adhered to the first substrate 13. Each of the elastic members 15 comprises two through hole portions 16, and two edge portions 16A which define the circumferences of the through hole portions 16, respectively. Each of the through hole portions 16 and each of the edge portions 16A has a step portion 41, and the respective through hole portion 16 and edge portion 16A form a stepped hole.

Next, with reference to FIG. 9, the positions of a translucent portion 27 and a sensor region 26 of a first substrate 13, and an edge portion 16A of each through hole portion 16 of each elastic member 15 with relative to each other will now be described by taking as an example a stop button 35 and a playback/pause button 36. (Note that in the second and third embodiments, the playback/pause button 36, the stop button 35, a tray eject button and a power button are disposed in this order from the left hand side as viewed from the front side, unlike in the first embodiments.) In the case of the stop button 35, the translucent portion 27 has a rectangular shape. (See FIG. 4.) The sensor region 26 has a circular shape. In this embodiment, the edge portion 16A of each through hole portion 16 has, for example, a cylindrical shape with a step portion, whose circumference passes at corner positions of the rectangular shape of the translucent portion 27. (See FIG. 4.) With this structure, the edge portion 16A (the section of the edge portion 16A which is brought into contact with the first substrate 13) is located on an outer side to the translucent portion 27 and on an inner side to the sensor region 26 in a plane parallel to the first substrate 13.

In the case of the playback/pause button 36, the translucent portion 27 has a shape of a combination of a triangle and two rectangles (geometrical shape). (See FIG. 7.) The sensor region 26 has a circular shape. Further, in this embodiment, the edge portion 16A of each through hole portion 16 has, for example, a cylindrical shape with a step portion, whose circumference passes at corner positions of the geometrical shape of the translucent portion 27. (See FIG. 7.) It should be noted here that the cylindrical shape of the edge portion 16A which corresponds to the playback/pause button 36 is located to be displaced with respect to the center of the sensor region 26 (translucent 27) (de-centered) and is formed larger than the edge portion 16A of each through hole portion 16 corresponding to the stop button 35. The edge portion 16A (the section of the edge portion 16A which is brought into contact with the first substrate 13) is located on an outer side to the translucent portion 27 and on an inner side to the sensor region 26 in a plane parallel to the first substrate 13.

With the shape of each through hole portion 16 and each edge portion 16A of the second embodiment, each translucent portion 27 can be brightly illuminated, and thus the appearance of the electronic device can be improved.

Figure 10:
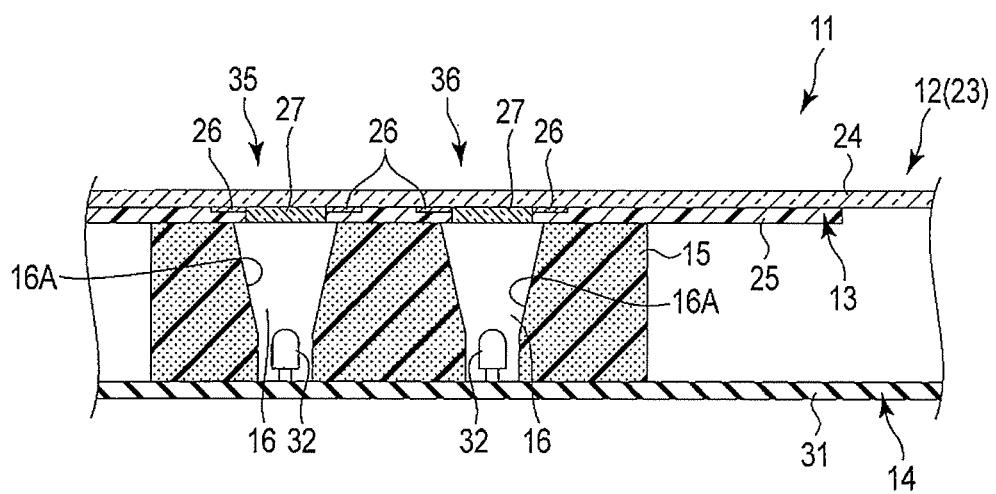
FIG. 10 is an exemplary cross sectional view showing along a horizontal direction, a part of a housing, a first substrate, a second substrate and an elastic member of an optical disk player, which is an example of the electronic device of the third embodiment.

An optical disk player 11 of the third embodiment shown in FIG. 10 comprises two elastic members 15. (Note that FIG. 10 shows only one elastic member.) Each of the elastic members 15 comprises two through hole portions 16, and two edge portions 16A which define the circumferences of the through hole portions 16, respectively. Each of the through hole portions 16 has such a shape which increases its diameter as becoming closer to the first substrate 13.

With reference to FIG. 10, the positions of a translucent portion 27 and a sensor region 26 of a first substrate 13, and an edge portion 16A of each through hole portion 16 of each elastic member 15 with relative to each other will now be described by taking as an example a stop button 35 and a playback/pause button 36. In the case of the stop button 35, the translucent portion 27 has a rectangular shape. (See FIG. 4.) The sensor region 26 has a circular shape. In this embodiment, the edge portion 16A of each through hole portion 16 has, for example, a cylindrical shape which increases its diameter as becoming closer to the first substrate 13, whose circumference passes at corner positions of the rectangular shape of the translucent portion 27. (See FIG. 4.) The edge portion 16A (the section of the edge portion 16A which is brought into contact with the first substrate 13) is located on an outer side to the translucent portion 27 and on an inner side to the sensor region 26 in a plane parallel to the first substrate 13.

In the case of the playback/pause button 36, the translucent portion 27 has a shape of a combination of a triangle and two rectangles (geometrical shape). (See FIG. 7.) The sensor region 26 has a circular shape. Further, in this embodiment, the edge portion 16A of each through hole portion 16 has, for example, a cylindrical shape which increases its diameter as becoming closer to the first substrate 13, whose circumference passes at corner positions of the geometrical shape of the translucent portion 27. (See FIG. 7.) It should be noted here that the cylindrical shape of the edge portion 16A which corresponds to the playback/pause button 36 is located to be displaced with respect to the center of the sensor region 26 (translucent 27) (de-centered) and is formed larger than the edge portion 16A of each through hole portion 16 corresponding to the stop button 35. The edge portion 16A (the section of the edge portion 16A which is brought into contact with the first substrate 13) is located on an outer side to the translucent portion 27 and on an inner side to the sensor region 26 in a plane parallel to the first substrate 13.

With the shape of each through hole portion 16 and each edge portion 16A of the third embodiment as well, each translucent portion 27 can be brightly illuminated, and thus the appearance of the electronic device can be improved.

The optical disk player 11, which is an example of the electronic device, is not limited directly to the above-described embodiments, but it can be realized while remodifying the structural elements thereof within the scope where the essence thereof remains. More specifically, the optical disk players 11 described above include such a type that can read out data from a memory device integrated in the electronic device or some other memory device in addition to the optical disk, and output images, music, etc. to the display device. Furthermore, various types of embodiments can be achieved by combining or rearranging various structural elements disclosed in the embodiment appropriately. For example, some of the structural elements may be deleted from the entire structure disclosed in the embodiment. Further, structural elements of various versions may be combined together as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
    a housing;
    a first substrate provided in the housing and comprising a sensor region which senses a touch of a hand of a user and a light transmitting portion provided on an inner side of the sensor region;
    a second substrate provided to be separated from the first substrate and comprising a light source which emits light towards the light transmitting portion; and
    an elastic member intermediating between the first substrate and the second substrate and comprising a through hole portion inside of which the light source and the light transmitting portion are provided,
    wherein an edge portion which defines a circumference of the through hole portion is situated on an outer side to the light transmitting portion and on an inner side to the sensor region.

2. The electronic device of claim 1, wherein the housing further comprises a positioning section which positions the first substrate.

3. The electronic device of claim 1, wherein the elastic member has a sponge-like form.

4. An electronic device comprising:
    a housing;
    a first substrate provided in the housing and comprising a plurality of sensor regions each of which senses a touch of a hand of a user and a plurality of light transmitting portions each provided on an inner side of each respective one of the sensor regions;
    a second substrate provided to be separated from the first substrate and comprising a plurality of light sources each of which emits light towards each respective one of the light transmitting portions; and
    an elastic member intermediating between the first substrate and the second substrate and comprising a plurality of through hole portions inside of each of which each respective one of the light sources and each respective one of the light transmitting portions are provided,
    wherein a plurality of edge portions each defining a circumference of each respective one of the through hole portions are each situated on an outer side to each respective one of the light transmitting portions and on an inner side to each respective one of the sensor regions.

5. The electronic device of claim 4, wherein the plurality of light transmitting portions are different from each other in size, and the plurality of through hole portions are different from each other in size.

6. An electronic device comprising:
    a first substrate comprising a sensor which senses a hand of a user, and a light transmitting portion provided inside the sensor;
    a second substrate comprising a light source which emits light towards the light transmitting portion; and
    an elastic member intermediating between the first substrate and the second substrate, the elastic member comprising a through hole portion provided in order to make the light emitted from the light source visible in the light transmitting portion,
    wherein the light source and the light transmitting portion are provided inside the through hole portion, and the light transmitting portion is provided inside the through hole portion such that the light emitted from the light source illuminates a range which is wider than the light transmitting portion and narrower than the sensor.

7. The electronic device of claim 6, wherein the through hole portion surrounds the light source and the light transmitting portion.

8. The electronic device of claim 6, wherein the elastic member has a sponge-like form.

\* \* \* \* \*